United States Patent
Blumenstein et al.

(10) Patent No.: US 12,209,995 B2
(45) Date of Patent: Jan. 28, 2025

(54) MEASUREMENT METHOD AND MEASUREMENT ARRANGEMENT FOR INTERFERENCE SUPPRESSION IN A RECEIVE SIGNAL OF AN EMAT TRANSDUCER

(71) Applicant: ROSEN SWISS AG, Stans (CH)

(72) Inventors: Eduard Blumenstein, Lingen (DE); Marcel Schemmann, BN Maria-Hoop (NL)

(73) Assignee: ROSEN 2 Holding AG, Stans (CH)

( * ) Notice: Subject to any disclaimer, the term of this patent is extended or adjusted under 35 U.S.C. 154(b) by 180 days.

(21) Appl. No.: 17/466,256

(22) Filed: Sep. 3, 2021

(65) Prior Publication Data
US 2022/0065823 A1   Mar. 3, 2022

(51) Int. Cl.
| G01N 29/32 | (2006.01) |
| G01N 29/24 | (2006.01) |
| G01R 31/00 | (2006.01) |
| H04B 11/00 | (2006.01) |

(52) U.S. Cl.
CPC ......... *G01N 29/32* (2013.01); *G01N 29/2412* (2013.01); *G01R 31/002* (2013.01); *H04B 11/00* (2013.01)

(58) Field of Classification Search
CPC .... H04B 11/00; G01N 29/50; G01N 29/4463; G01N 29/32; G01N 29/2412; G01F 1/667; G01F 1/66; G01R 31/002
See application file for complete search history.

(56) References Cited

U.S. PATENT DOCUMENTS

| 4,307,616 A * | 12/1981 | Vasile | G01N 29/38 |
| | | | 73/620 |
| 8,201,454 B2 * | 6/2012 | Paige | G01N 29/2412 |
| | | | 73/623 |
| 2005/0192727 A1 * | 9/2005 | Shostak | G07C 5/0808 |
| | | | 701/1 |

(Continued)

FOREIGN PATENT DOCUMENTS

| DE | 102010006275 A1 | 7/2011 |
| DE | 102018122584 A1 | 9/2019 |

OTHER PUBLICATIONS

Explosion Protection—Technical Principles (Year: 2017).*
Cuixiang, Inspection of delamination defect in first wall with a flexible EMAT-scanning system (Year: 2018).*

*Primary Examiner* — Daniel L Murphy
*Assistant Examiner* — Amie M Ndure
(74) *Attorney, Agent, or Firm* — Hasch Blackwell LLP

(57) ABSTRACT

A measurement method is provided on an electrically conducting object. A first ultrasound wave is generated in the object by means of a first EMAT transmit transducer of a measurement arrangement. A first EMAT receive transducer of the measurement arrangement detects a first receive signal. The first receive signal comprises a first ultrasound signal resulting at least partially from the first ultrasound wave which has propagated through at least a part of the object, as well as a first electromagnetic interference signal. A second receive signal is also detected comprising a second electromagnetic interference signal by means of a first receive means of the measurement arrangement. The first receive signal and the second receive signal are processed jointly. At least the first receive signal is at least partially interference-suppressed.

32 Claims, 8 Drawing Sheets

(56) References Cited

U.S. PATENT DOCUMENTS

| | | | |
|---|---|---|---|
| 2006/0025897 A1* | 2/2006 | Shostak | G08G 1/017 701/1 |
| 2007/0231872 A1 | 10/2007 | Butters et al. | |
| 2009/0139337 A1* | 6/2009 | Owens | G01N 29/30 73/622 |
| 2009/0150094 A1* | 6/2009 | Van Velsor | G01N 29/2462 702/56 |
| 2009/0283569 A1 | 11/2009 | Ramaswamy et al. | |
| 2009/0295317 A1* | 12/2009 | Townsend | H02K 11/05 318/400.4 |
| 2011/0041612 A1* | 2/2011 | Paige | G01N 29/2412 73/623 |
| 2012/0235567 A1* | 9/2012 | Karalis | H02J 7/0047 315/70 |
| 2012/0248888 A1* | 10/2012 | Kesler | H02J 50/90 307/104 |
| 2012/0280765 A1* | 11/2012 | Kurs | B60L 53/124 336/200 |
| 2012/0313742 A1* | 12/2012 | Kurs | B60L 53/126 336/180 |
| 2014/0225449 A1* | 8/2014 | Kurs | H01F 27/2823 361/679.01 |
| 2014/0371931 A1* | 12/2014 | Lin | E06B 9/24 700/287 |
| 2015/0270719 A1* | 9/2015 | Kurs | H02J 50/12 320/108 |
| 2016/0043571 A1* | 2/2016 | Kesler | H02J 50/30 307/104 |
| 2016/0087687 A1* | 3/2016 | Kesler | H02J 50/80 307/104 |
| 2019/0072327 A1* | 3/2019 | Kisner | F26B 23/10 |
| 2019/0140554 A1* | 5/2019 | Cummings | H02M 7/44 |
| 2020/0181555 A1* | 6/2020 | Hinojosa | B01L 3/502738 |
| 2021/0018349 A1* | 1/2021 | Brücher | G01N 29/024 |

* cited by examiner

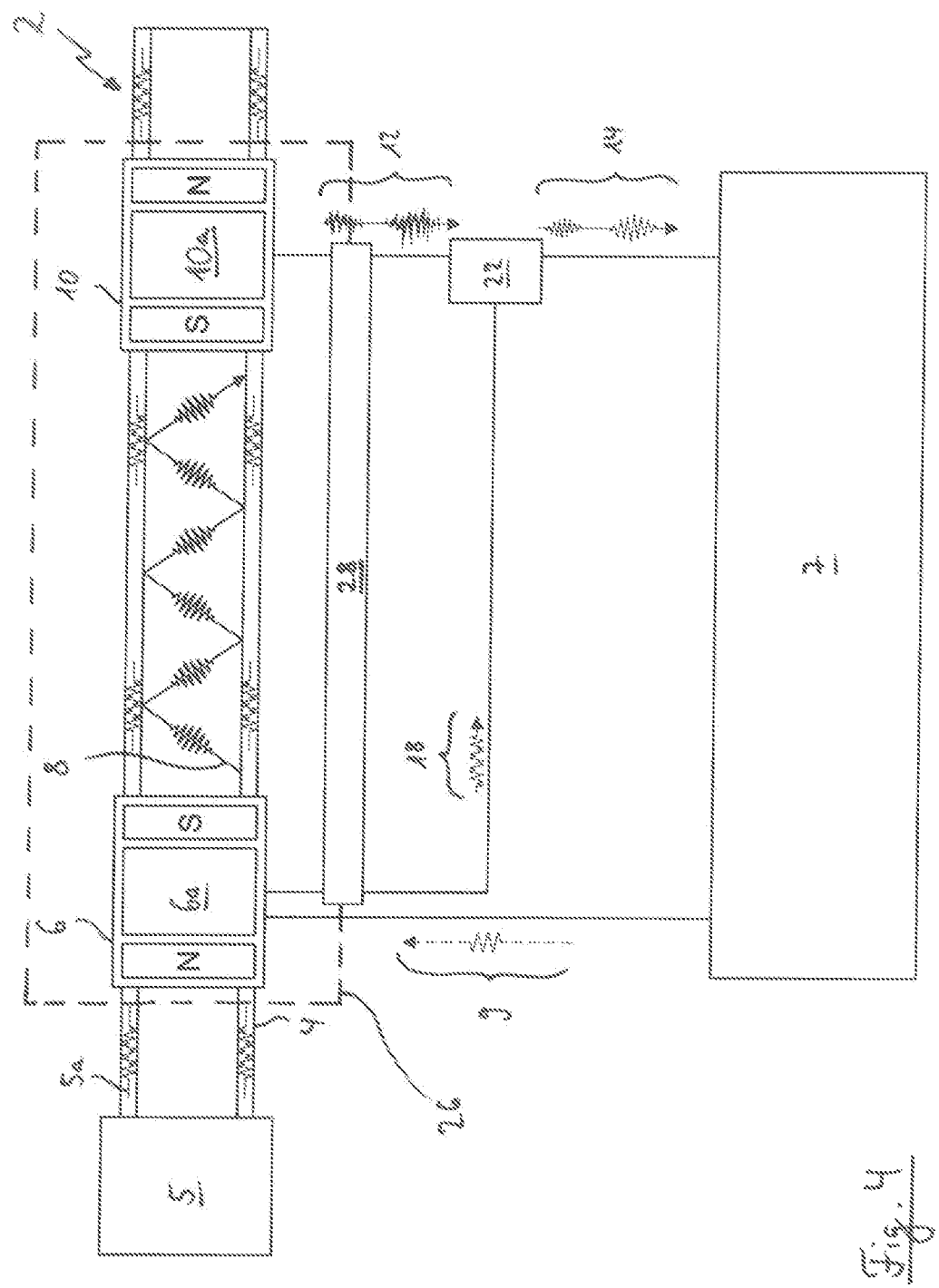

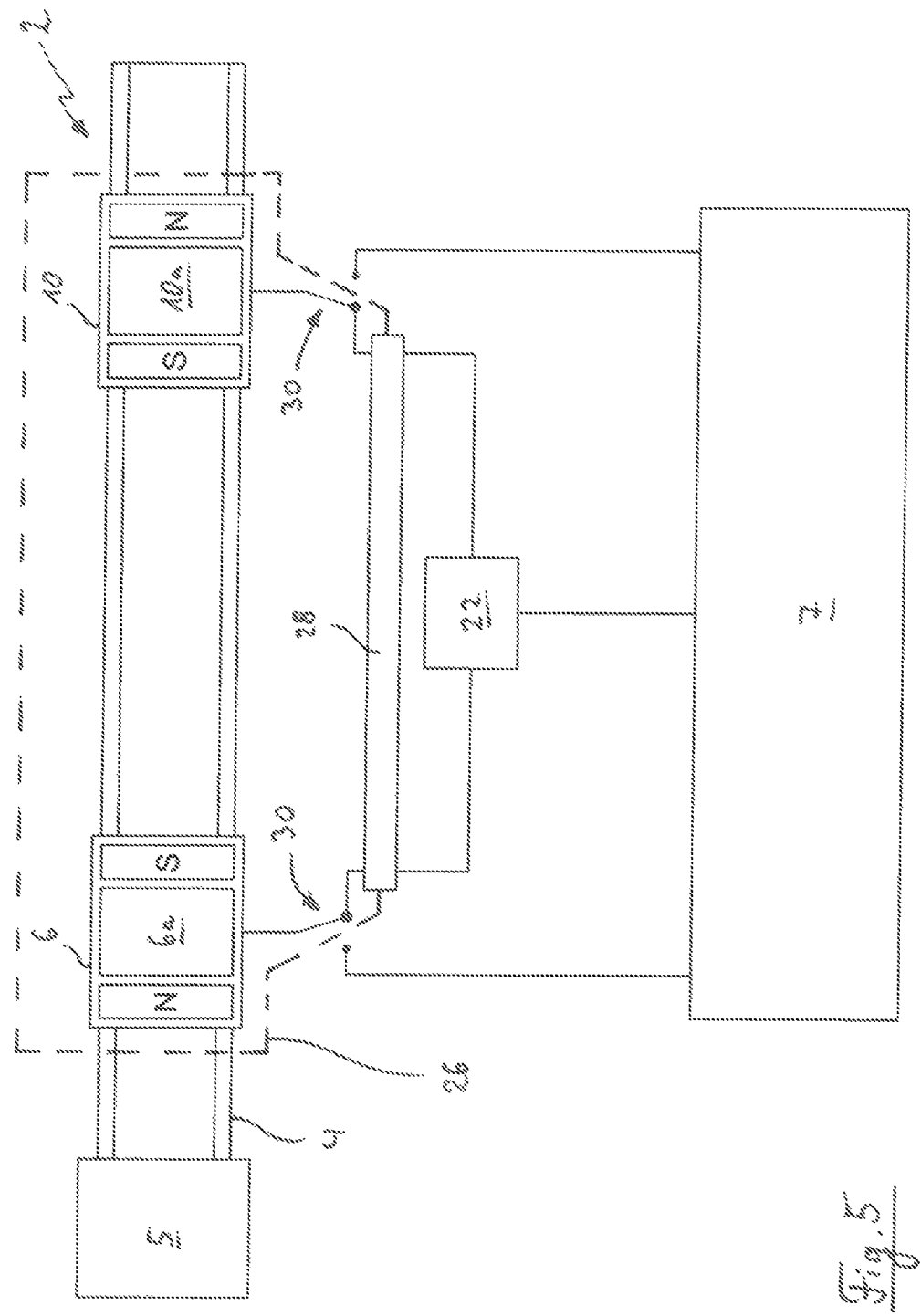

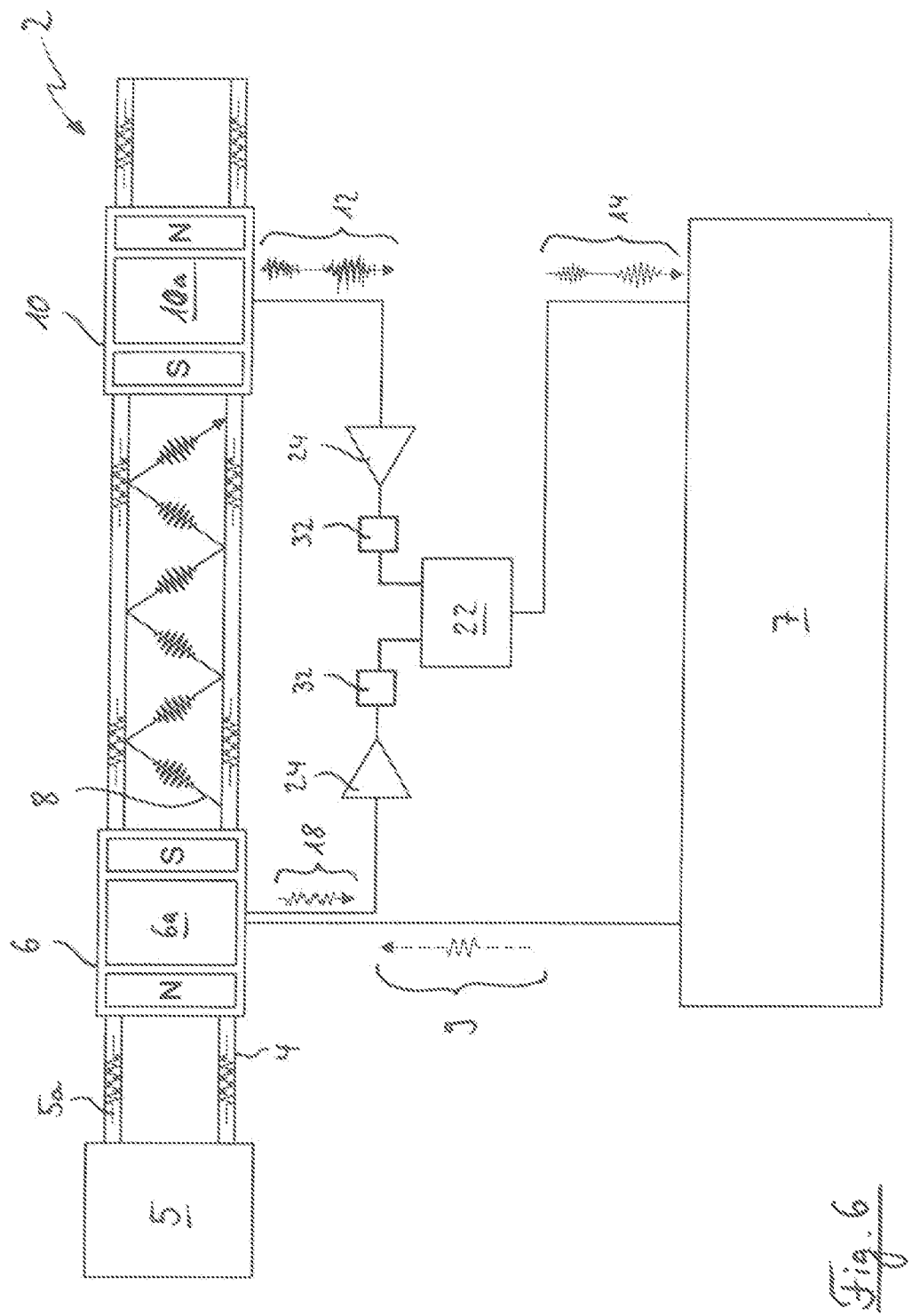

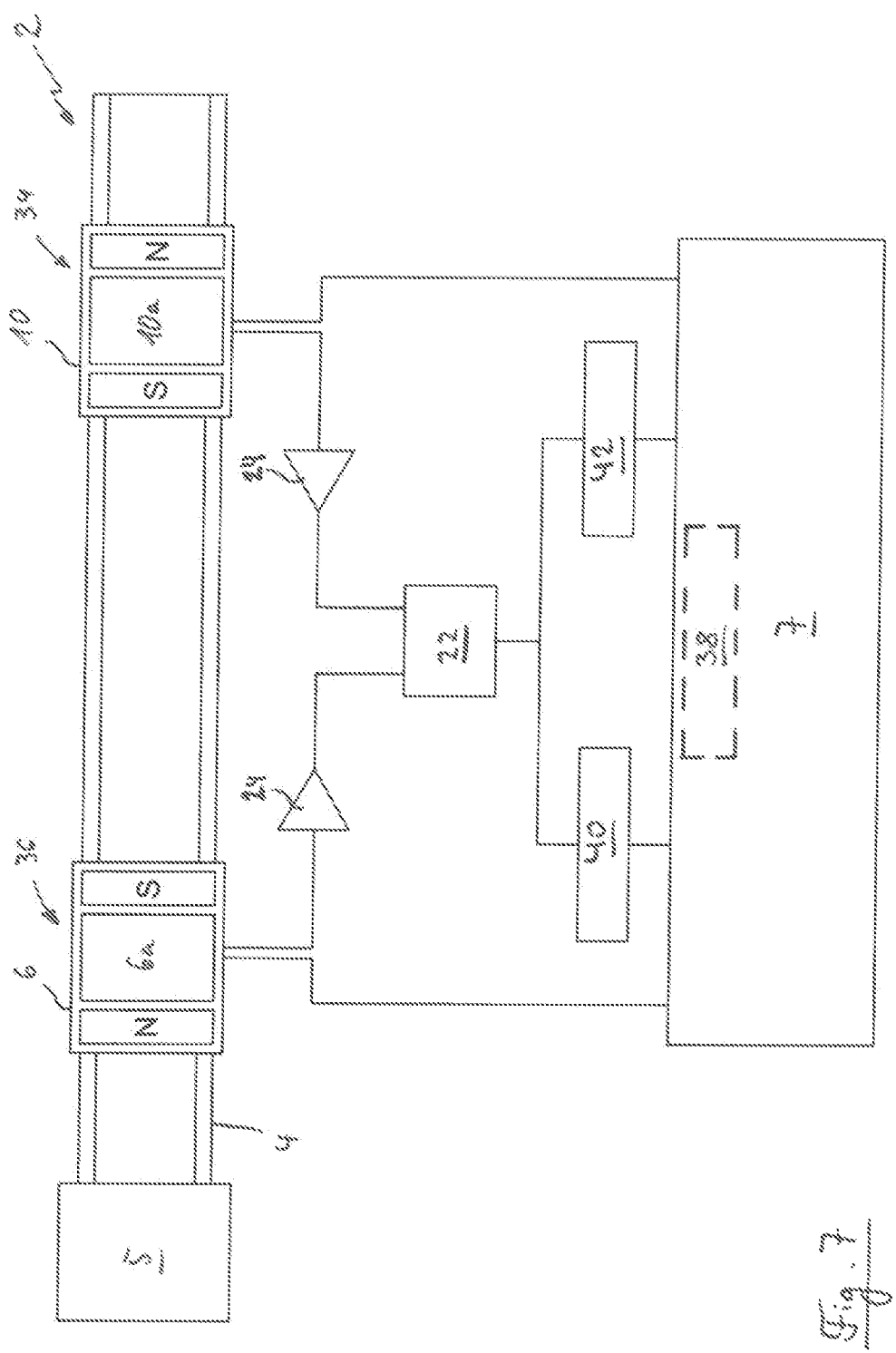

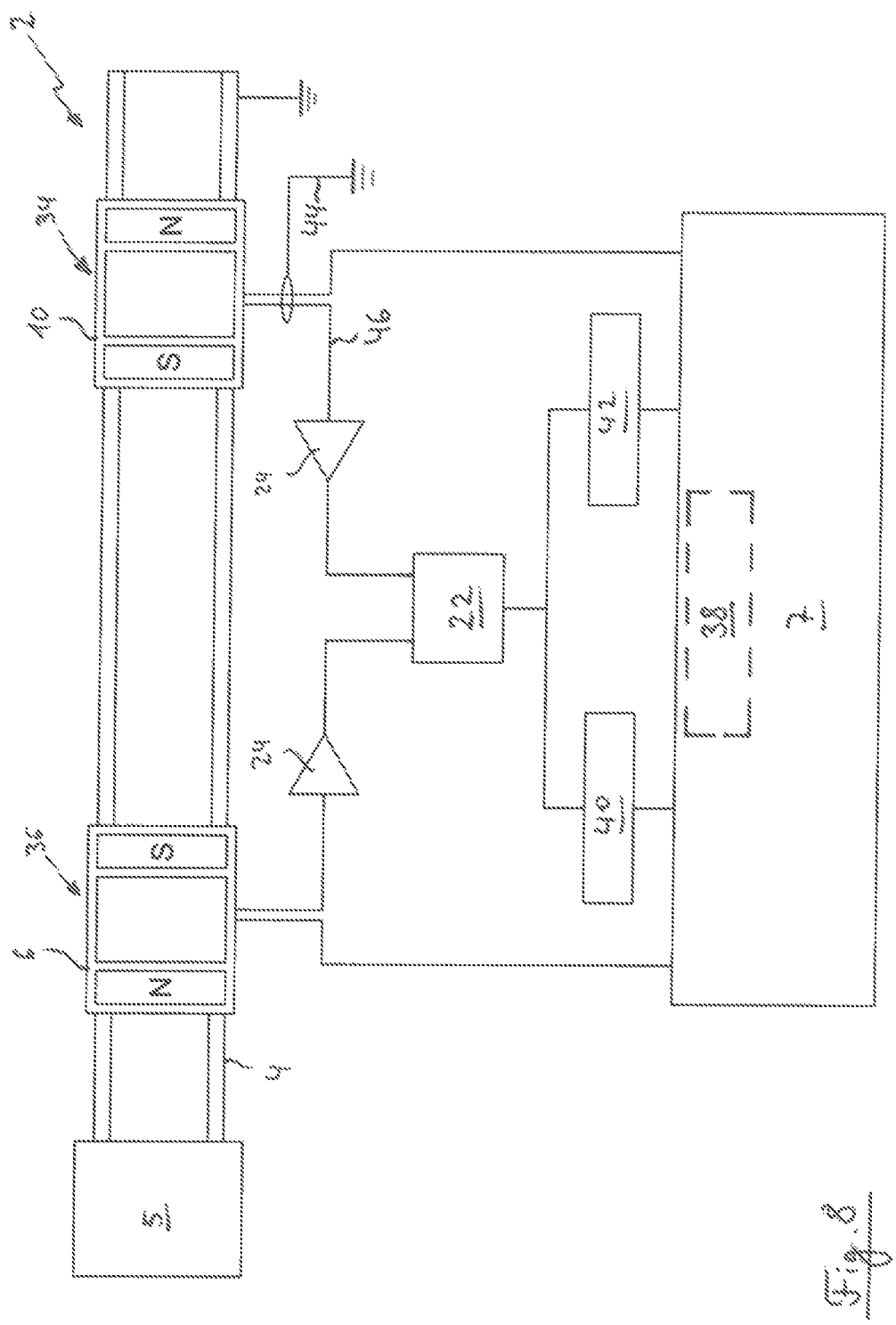

MEASUREMENT METHOD AND MEASUREMENT ARRANGEMENT FOR INTERFERENCE SUPPRESSION IN A RECEIVE SIGNAL OF AN EMAT TRANSDUCER

CROSS-REFERENCE TO RELATED APPLICATIONS

This application claims priority to German Application No. 10 2020 123072.9, filed Sep. 3, 2020 the entirety of which is hereby incorporated by reference.

FIELD OF THE INVENTION

The invention relates to a measurement method on an electrically conducting object, in particular on a pipeline, wherein a first ultrasound wave is generated in the object by means of a first EMAT transmit transducer of a measurement arrangement which is positioned on or near a surface of the object and which has a first transmit transducer induction coil having at least one conductor path, and a first EMAT receive transducer of the measurement arrangement which is positioned on or near the surface of the object and which has a first receive transducer induction coil having at least one conductor path detects a first receive signal, wherein the first receive signal comprises a first ultrasound signal resulting at least partially from the first ultrasound wave which has propagated through at least a part of the object, and a first electromagnetic interference signal. The invention further relates to a measurement arrangement to carry out a method of this type.

BACKGROUND OF THE INVENTION

EMAT transducers are used in various branches of industry in non-destructive testing and measurement methods. One advantage of this technology is that acoustic waves can be generated contactlessly, i.e. without an acoustic coupling by means of a coupling medium, in a conductive object. For this reason, EMAT transducers are particularly suitable for use under harsher operating conditions, for example when particularly high or low temperatures prevail on the object.

The mode of operation of EMAT transducers is based on an interplay of an induction coil with a magnet. The magnet, which can be designed as a permanent magnet or electromagnet, magnetises a part of the surface of the conductive object. If the induction coil is driven with an alternating current, it generates an alternating current magnetic field which generates eddy currents in the conductive object which in turn interact with the magnetic field of the magnet. The magnetic field can be a static magnetic field of a permanent magnet or a quasi-static magnetic field of an electromagnet which is driven at a much lower frequency than the induction coil. Depending on the alternating current driving the induction coil, an ultrasound wave is generated in the object, e.g. in the form of a single ultrasound pulse, i.e. a wave packet comprising a plurality of, for example sinusoidal, oscillations, or in the form of a sequence of ultrasound pulses which is generally referred to as a pulse burst.

During the detection, this interaction process runs in the opposite direction: The ultrasound wave which has propagated through at least a part of the object interacts with the static or quasi-static magnetic field of the EMAT receive transducer and generates eddy currents in the object which in turn generate an alternating magnetic field which induces an ultrasound signal in the induction coil. Information relating to the object, such as, for example, stress corrosion cracks or defects in a coating of the object, and possibly characteristics of a medium flowing through the object also, e.g. its flow rate, can be determined from this ultrasound signal.

For both the generation and the detection of ultrasound waves, it suffices if the EMAT transducers are positioned close to a surface of the object in such a way that the fields of the EMAT transducers still act on the object or a wall of the object, i.e. can generate or detect ultrasound waves there. A direct contact between the EMAT transducers and the object is not required for this purpose.

Along with the ultrasound signal representing the actual useful signal, electromagnetic interference signals are injected into the induction coil of the EMAT receive transducer which is normally galvanically isolated from the object on which the measurement is carried out. The receive signal is affected by noise from these interference signals.

Interference thus occurs, for example, in measurements of the flow rate of a medium flowing through a pipeline, said interference being generated by interference sources, such as, for example, motors or frequency converters, and propagating over long distances through the pipeline wall. This interference can be injected into the measurement system in the form of interference signals. Similarly, a potential difference between the measurement system and the object normally galvanically isolated therefrom and earthed can also be injected into the measurement system as a further interference signal. On the whole, the interference signals which occur result in a worsened signal-to-noise ratio, so that information relating to the object and possibly also characteristics of a medium flowing through the object cannot be optimally determined.

BRIEF SUMMARY OF THE INVENTION

The object of the present invention is therefore to provide an EMAT-based measurement method and an EMAT-based measurement arrangement with an improved signal-to-noise ratio.

The method according to the invention is characterised by the following steps: detecting a second receive signal comprising at least a second electromagnetic interference signal, in particular while the first receive signal is detected by the EMAT transducer, by means of a first receive means of the measurement arrangement; and joint processing of at least the first receive signal and the second receive signal in an interference suppression operation by means of an interference suppression means of the measurement arrangement, wherein at least the first receive signal is at least partially interference-suppressed.

An additional receive channel is provided for the interference signal by the first receive means and the interference is thus tapped once more independently from the first EMAT receive transducer. Assuming that the first interference signal is essentially identical to or at least correlates with the second interference signal, the second interference signal can be used to anticipate the characteristic of the first interference signal and filter it out from the first receive signal. To do this, the first receive signal and the second receive signal are processed jointly in an interference suppression operation by means of interference suppression means. The first receive signal is thus at least partially interference-suppressed, i.e. the ratio between the ultrasound signal and the interference signal is improved in the receive signal.

An operation in which at least the first receive signal and the second receive signal are jointly processed is referred to as an interference suppression operation, whereupon the ratio between the first ultrasound signal and the first interference signal is improved in the first receive channel, i.e. the proportion of the first interference signal in the first receive signal decreases. A subtraction, for example, of the second receive signal, possibly multiplied by a factor, from the first receive signal can thus represent an interference suppression operation of this type. However, other noise suppression operations can also be used, insofar as they correspond to the aforementioned definition of an interference suppression operation.

The measurement arrangement preferably comprises a control and evaluation unit which controls and reads the EMAT transducers and also evaluates the received signals. In particular, the interference suppression means can be integrated into the control and evaluation unit, for example in the form of software running on the control and evaluation unit.

In one preferred design of the invention, the second receive signal is detected by a receive means induction coil of the first receive means positioned on or near the surface of the object and having at least one conductor path. An interference signal captured with an induction coil separate from the first receive transducer induction coil is referred to below as a coil interference signal. In this design, both the first interference signal and the second interference signal are detected by means of an induction coil, whereby the interference signals are largely similar to one another. A particularly reliable interference suppression operation can thus be achieved, for example by subtracting the second receive signal from the first receive signal. It is particularly advantageous if the receive means induction coil used to detect the second receive signal is essentially identical in structure to the first receive transducer induction coil, e.g. has the same external dimensions and the same number of windings. In an embodiment of this type, the first interference signal and the second interference signal are largely similar, in particular virtually identical, thus enabling an even more reliable interference suppression operation.

According to a further preferred design of the invention, the first transmit transducer induction coil or a further induction coil of the measurement arrangement differing from the receive transducer induction coil is used as the receive means induction coil for detecting the second receive signal. Since sound normally propagates through the conducting object more slowly by orders of magnitude than an electromagnetic signal, various transducer configurations are possible in which the distance between the receive transducer and a further transducer of the measurement arrangement are dimensioned in such a way that, if the receive transducer captures an ultrasound signal, no or virtually no ultrasound signal is present on the further transducer, for example on the transmit transducer assigned with the receive transducer or on a transducer of a further transceiver pair of the measurement arrangement. In this case, the induction coil of this further transducer can be used as a receive means. Already existing components of the measurement arrangements are thus used to detect the second interference signal which is used for the interference suppression operation. An interference suppression can be achieved particularly simply and economically as a result. The improved measurement method can further be implemented in a simple manner on existing systems also.

In a further advantageous design of the invention, the second receive signal is detected by means of a line of the measurement arrangement connected in an electrically conducting manner to the object or to an earthed housing part of a housing protecting the measurement arrangement or otherwise earthed as the first receive means. An interference signal measured separately with a line of this type is referred to below as an earthing interference signal. In this way, an interference signal, in particular, originating from a potential difference between the EMAT system and the normally earthed object can be captured separately and processed to improve the signal-to-noise ratio in the interference suppression operation. Since the earth potential is a reference point for the potential difference causing the noise, any type of earthed contact can be used, where appropriate, as a receive means for the purpose of the separate detection of the earthing interference signal.

The second receive signal tapped via the line is preferably injected, in particular capacitively, into a measurement line of the measurement arrangement while maintaining a galvanic isolation. In this way, the second interference signal can be detected without influencing the potential difference between the EMAT system and the object and therefore the first interference signal, which would itself have negative effects on the interference suppression operation and possibly on the ultrasound measurement also. The method is thereby further suitable for those measurement applications in which a galvanic isolation must be maintained without fail, for example due to safety regulations. The second receive signal can be injected while maintaining a galvanic isolation, for example, through capacitive or inductive isolation of the measurement circuits.

According to a further preferred design of the invention, at least the first receive signal and the second receive signal are fed to an analogue and/or digital, electrical and/or electronic component or to an analogue and/or digital, electrical and/or electronic circuit as the interference suppression means, in particular wherein the interference suppression operation comprises at least a subtraction of the receive signals, preferably a subtraction of the second receive signal from the first receive signal. An interference suppression means designed in this way can be implemented simply and economically.

The use of a common-mode choke as the interference suppression means in which the first receive signal and the second receive signal are fed to the inputs of the common-mode choke and are subjected to an inductive subtraction as the interference suppression operation is particularly advantageous. The common-mode choke has a plurality of identical windings through which the receive signals flow in the opposite direction so that their magnetic fields cancel each other out in the core of the common-mode choke. The second interference signal which is largely similar, in particular essentially identical, to the first interference signal is subtracted from the first receive signal, as a result of which only the first ultrasound signal ideally remains in the first receive signal.

Alternatively, a data processing system to which the first receive signal and the second receive signal are fed can also be used as the interference suppression means. The interference operation can be implemented by software running on the data processing system. A data processing system of this type can be formed, in particular, by a control and evaluation unit of the measurement arrangement.

In a further advantageous design of the invention, the first receive signal and the second receive signal pass through a first amplifier stage before they are processed in the interference suppression operation. As a result, particularly if interference suppression means are used which have inductive components, such as e.g. a common-mode choke, the inductance is not increased in a sensor area of the measurement arrangement located, in particular, upstream of the amplifier stage and comprising at least the first EMAT transmit transducer and the first EMAT receive transducer, as a result of which the method is also applicable in environments at risk from explosion.

According to a further preferred design of the invention, the first receive signal and the second receive signal pass through an explosion protection barrier (EX barrier) of the measurement arrangement protecting the sensor area of the measurement arrangement before they are processed in the interference suppression operation. Particularly if interference suppression means are used which have inductive components, such as e.g. a common-mode choke, an increase in the inductance in the sensor area is thus prevented, as a result of which the method can also be applied in environments at risk from explosion. Voltage-limiting diodes are preferably used to implement the explosion protection barrier.

In a further advantageous design of the invention, the first receive signal and the second receive signal are subjected to a correlation analysis, in particular before the interference suppression operation, wherein a correlation, in particular an amplitude and/or phase relationship, between the first electromagnetic interference signal and the second electromagnetic interference signal is determined, particularly in the form of corresponding correlation factors.

In the case of the earthing interference signal, for example, it can be assumed that this signal does not correlate with the ultrasound signals, so that a correlation analysis of the receive signals indicates only a correlation of the first interference signal with the second interference signal.

In practice, the correlation of the interference signals depends on different factors, for example the choice of the receive means (e.g. induction coil or earthed line), the distance to the receive means from the object or the distance from the receive means to the EMAT receive transducer. A relationship between the interference signals can be expressed via the following formula:

first interference signal=correlation factor*second interference signal

If a relationship is determined between the interference signals by determining corresponding correlation factors, characteristics of the first interference signal can be predicted or anticipated more effectively by means of a continuous measurement of the second interference signal. This prediction can then be used during the interference suppression operation in order to achieve an improved interference suppression of the first receive signal.

EMAT transducers are normally capable of generating and detecting ultrasound waves in a certain frequency bandwidth. Components of interference which lie within this frequency bandwidth are injected into the measurement system and can have different characteristics for different frequencies of the ultrasound wave. In a further preferred embodiment of the invention, a correlation analysis is therefore preferably carried out for at least two different frequencies depending on the frequency of the first ultrasound wave. The frequency at which the interference is injected less into the measurement system can thereby be determined and chosen for the performance of measurements.

According to a further preferred design of the invention, the first electromagnetic interference signal and at least the second electromagnetic interference signal are detected jointly, the first electromagnetic interference signal by means of the first EMAT receive transducer, and at least the second electromagnetic interference signal by means of the first receive means, in particular before and/or after the generation and/or the detection of the first ultrasound wave, wherein a correlation, in particular an amplitude and/or phase relationship, between the first electromagnetic interference signal and the second electromagnetic interference signal is determined, particularly in the form of corresponding correlation factors. A correlation between the interference signals can thereby be determined, in particular already in advance of any ultrasound measurements, so that characteristics of the first interference signal can be predicted or anticipated by means of a continuous measurement of the second interference signal and can be processed in the interference suppression operation.

The first receive signal and the second receive signal or the first interference signal and the second interference signal are preferably measured jointly over a time period which extends beyond the duration of a single measurement, i.e. the time interval from the transmission of an ultrasound wave to the detection of the signal resulting therefrom. In particular, the signals are measured jointly over a time period which corresponds to at least four times, preferably at least ten times, the duration of a single measurement.

In a further advantageous design of the invention, the correlation analysis is carried out multiple times in succession, wherein weighted correlation factors are determined on the basis of a statistical analysis of correlation factors determined by means of respective correlation analyses. Said weighted correlation factors can then be processed in the interference suppression operation, resulting in an improved interference suppression of the first receive signal. Correlation analyses are preferably performed continuously in the continuous measurement operation and respective correlation factors are updated so that the first receive signal can be optimally interference-suppressed according to the instantaneous characteristic of the interference.

According to a further preferred design of the invention, the following steps are carried out: detecting a third receive signal differing, in particular, from the second receive signal and comprising at least a third electromagnetic interference signal, in particular while the first receive signal is detected by the first EMAT receive transducer, by means of a second receive means of the measurement arrangement differing from the first receive means, wherein the third electromagnetic interference signal is a coil interference signal or an earthing interference signal; and joint processing of at least the third receive signal with the first receive signal and the second receive signal in the interference suppression operation by means of the interference suppression means of the measurement arrangement, wherein at least the first receive signal is at least partially interference-suppressed.

At least two further receive signals differing from one another are thus detected for the interference suppression of the first receive signal. The second interference signal is a coil interference signal and the third interference signal is an earthing interference signal, or the second interference signal is an earthing interference signal and the third interference signal is a coil interference signal. Otherwise, the details described in the application as a whole for the first receive means, the second receive signal and the second interference signal apply accordingly to the second receive means, the third receive signal and the third interference signal. In this way, two types of interference, i.e. both the coil interference signal and the earthing interference signal are used for the interference suppression of the first receive signal, resulting in a further improvement in the signal-to-noise-ratio.

In a further advantageous design of the invention, a second ultrasound wave is generated in the object by means of a second EMAT transmit transducer of the measurement arrangement which is positioned on or near the surface of the object and which has a second transmit transducer induction coil having at least one conductor path, wherein a second EMAT receive transducer of the measurement arrangement which is positioned on or near the surface of the object and which has a second receive transducer induction coil having at least one conductor path detects the second receive signal wherein, in addition to the second electromagnetic interference signal, the second receive signal comprises a second ultrasound signal resulting at least partially from the second ultrasound wave which has propagated through at least a part of the object, wherein the first ultrasound wave is modulated with a first modulation pattern and the second ultrasound wave is modulated with a second modulation pattern so that, following the detection, a unique assignment of the first ultrasound signal to the first ultrasound wave and of the second ultrasound signal to the second ultrasound wave is enabled, wherein both the first receive signal and the second receive signal are in each case at least partially interference-suppressed by means of the joint processing in the interference suppression operation, wherein, following the interference suppression operation, the first ultrasound signal and the second ultrasound signal are obtained separately by means of a demodulation.

As a result, the present method is suitable for a multiplicity of EMAT-based measurement and testing methods in which ultrasound measurements carried out in parallel are necessary or desirable. Both receive signals are at least partially interference-suppressed, i.e. both the first interference signal and the second interference signal are at least partially filtered out, through the processing of the first receive signal and the second receive signal in the interference suppression operation.

The interference suppression operation can be performed, for example, by subtracting the second receive signal from the first receive signal or vice versa. However, other operations can also be used for the noise suppression, insofar as they correspond to the definition according to the invention of an interference suppression operation. Assuming that the first interference signal is virtually identical to the second interference signal, the interference signals cancel one another out in the interference suppression operation. Only the first ultrasound signal and the second ultrasound signal ideally remain, which are then separated from one another by means of the demodulation.

In particular, EMAT transducers which are designed for both transmission and reception are used for the measurement method according to the invention, so that, for example, the first EMAT transmit transducer is simultaneously the second EMAT receive transducer and the second EMAT transmit transducer is simultaneously the first EMAT receive transducer. Fewer components are thus required to carry out the measurement method, as a result of which said method can be implemented more cost-effectively.

In particular, the modulation comprises at least an amplitude and/or phase modulation. The modulation patterns used for the modulation are preferably orthogonal to one another, as a result of which a particularly reliable assignment of the ultrasound signals to the corresponding ultrasound waves is guaranteed.

At least the first ultrasound wave and/or the second ultrasound wave is/are generated as a sequence of ultrasound pulses (pulse burst) and are modulated with a defined sequence of amplitude and/or phase values, i.e. a modulation takes place from pulse to pulse or from wave packet to wave packet within a pulse burst. A particularly reliable assignment of the ultrasound signals to the corresponding ultrasound waves can thereby be achieved.

According to the details already described above and also those described below, the object defined above is also achieved by a measurement arrangement according to Claim 18, wherein the measurement arrangement is designed to carry out the measurement method described above or below. A measurement arrangement of this type comprises a first EMAT transmit transducer which is positioned on or near a surface of the object and which has a first transmit transducer induction coil having at least one conductor path for the generation of a first ultrasound wave in the object, and also a first EMAT receive transducer which is positioned on or near the surface of the object and which has a first receive transducer induction coil having at least one conductor path for detecting a first receive signal, wherein the first receive signal comprises a first ultrasound signal resulting at least partially from the first ultrasound wave which has propagated through at least a part of the object, and a first electromagnetic interference signal The measurement arrangement is characterised in that it comprises a first receive means for detecting a second receive signal comprising at least a second electromagnetic interference signal, and also an interference suppression means, wherein the measurement arrangement is designed to process the first receive signal and the second receive signal by means of the interference suppression means in an interference suppression operation which at least partially suppresses the interference of at least the first receive signal.

Through the separate detection of the second interference signal, said second interference signal can be used to filter the first interference signal out from the first receive signal and thus improve the signal-to-noise ratio.

According to one preferred design of the invention, the first receive means comprises a receive means induction coil, whereby the detected interference signals are largely similar to one another. The receive means induction coil is particularly preferably at least essentially identical in structure to the first receive transducer induction coil, whereby the interference signals are largely similar, in particular virtually identical, to one another. The signal-to-noise ratio can be improved by these measures, as already explained accordingly for the associated measurement method.

The receive means induction coil is preferably formed by the first transmit transducer induction coil or a further induction coil of the measurement arrangement differing from the receive transducer induction coil. Already existing components of the measurement arrangement are thus used for the low-cost implementation of the interference suppression.

In a further preferred design of the invention, the measurement arrangement comprises a line connected in an electrically conducting manner to the object or to an earthed housing part of a housing protecting the measurement arrangement or otherwise earthed for detecting the second receive signal. In this way, an interference signal, in particular, originating from a potential difference between the EMAT system and the normally earthed object can be captured separately and processed to improve the signal-to-noise ratio in the interference suppression operation, as already explained accordingly for the associated measurement method. The line is preferably connected to a measurement line of the measurement arrangement via a signal-transmitting, in particular capacitive, connection while maintaining a galvanic isolation.

According to a further preferred design of the invention, the interference suppression means comprises an analogue and/or digital electrical and/or electronic component, in particular a common-mode choke, or an analogue and/or digital, electrical and/or electronic circuit. An interference suppression means designed in this way can be implemented simply and economically. Alternatively, a data processing system can also be used as the interference suppression means, wherein the interference suppression operation can be implemented by software running on the data processing system. A control and evaluation unit of the measurement arrangement preferably serves as a data processing system on which the interference suppression operation is implemented.

A first amplifier stage of the measurement arrangement is preferably connected between the interference suppression means on the one hand and the first EMAT receive transducer and the first receive means on the other hand. As a result, the method is also applicable in areas at risk from explosion, as already explained accordingly for the associated measurement method.

In particular, an explosion protection barrier (EX barrier) is configured between the interference suppression means on the one hand and at least the first EMAT receive transducer and the first receive means on the other hand. As a result, the method is also applicable in areas at risk from explosion, as already explained accordingly for the associated measurement method.

The measurement arrangement preferably comprises an evaluation unit to perform a correlation analysis according to one of Claims 11 to 14. In this way, a relationship between the interference signals can be defined by determining corresponding correlation factors, and characteristics of the first interference signal can thus be predicted or anticipated by means of a continuous measurement of the second interference signal. This prediction can then be used during the interference suppression operation in order to achieve an improved interference suppression of the first receive signal, as already explained accordingly for the associated measurement method.

According to a further preferred design of the invention, the measurement arrangement comprises a second receive means for detecting a third receive signal comprising at least a third electromagnetic interference signal, wherein the measurement arrangement is designed to process at least the third receive signal with the first receive signal and with the second receive signal in an interference suppression operation which at least partially suppresses the interference of at least the first receive signal. At least two further receive signals differing from one another are thus detected and processed for the interference suppression of the first receive signal, resulting in a further improvement in the signal-to-noise ratio, as already discussed accordingly for the associated measurement method.

In a further preferred design of the invention, the measurement arrangement comprises a second EMAT transmit transducer which is positioned on or near the surface and which has a second transmit transducer induction coil having at least one conductor path for the generation of a second ultrasound wave in the object, wherein the measurement arrangement further comprises a second EMAT receive transducer which is positioned on or near the surface of the object and which has a second receive transducer induction coil having at least one conductor path for detecting the second receive signal, wherein, in addition to the second electromagnetic interference signal, the second receive signal comprises a second ultrasound signal resulting at least partially from the second ultrasound wave which has propagated through at least a part of the object, wherein the measurement arrangement further comprises at least one modulation means which modulates the first ultrasound wave with a first modulation pattern and the second ultrasound wave with a second modulation pattern so that, following the detection, a unique assignment of the first ultrasound signal to the first ultrasound wave and of the second ultrasound signal to the second ultrasound wave is enabled, wherein the measurement arrangement is designed in such a way that both the first receive signal and the second receive signal are in each case at least partially interference-suppressed by the common processing in the interference suppression operation, wherein the measurement arrangement further comprises at least one demodulation means and the measurement arrangement is designed in such a way that, following the interference suppression operation, the first ultrasound signal and the second ultrasound signal are separated.

As a result, the present method is suitable for improving the signal-to-noise ratio for a multiplicity of EMAT-based measurement and testing methods in which ultrasound measurements performed in parallel are necessary or desirable, as already explained accordingly for the associated measurement method.

In particular, the EMAT transducers are designed for both transmission and reception, so that, for example, the first EMAT transmit transducer is simultaneously the second EMAT receive transducer, and the second EMAT transmit transducer is simultaneously the first EMAT receive transducer, thus enabling a particularly compact implementation of the interference suppression.

It is expressly noted that the designs of the invention explained above are combinable in each case separately or in any technically appropriate combination with one another in each case with the subject-matter of one of the independent claims.

BRIEF DESCRIPTION OF THE DRAWINGS

Reference is now made more particularly to the drawings, which illustrate the best presently known mode of carrying out the invention and wherein similar reference characters indicate the same parts throughout the views.

FIG. 4 shows a further embodiment of the invention.
FIG. 5 shows a further embodiment of the invention.
FIG. 6 shows a further embodiment of the invention.
FIG. 7 shows a further embodiment of the invention.
FIG. 8 shows a further embodiment of the invention.

DETAILED DESCRIPTION OF THE DRAWINGS

Figure 1:
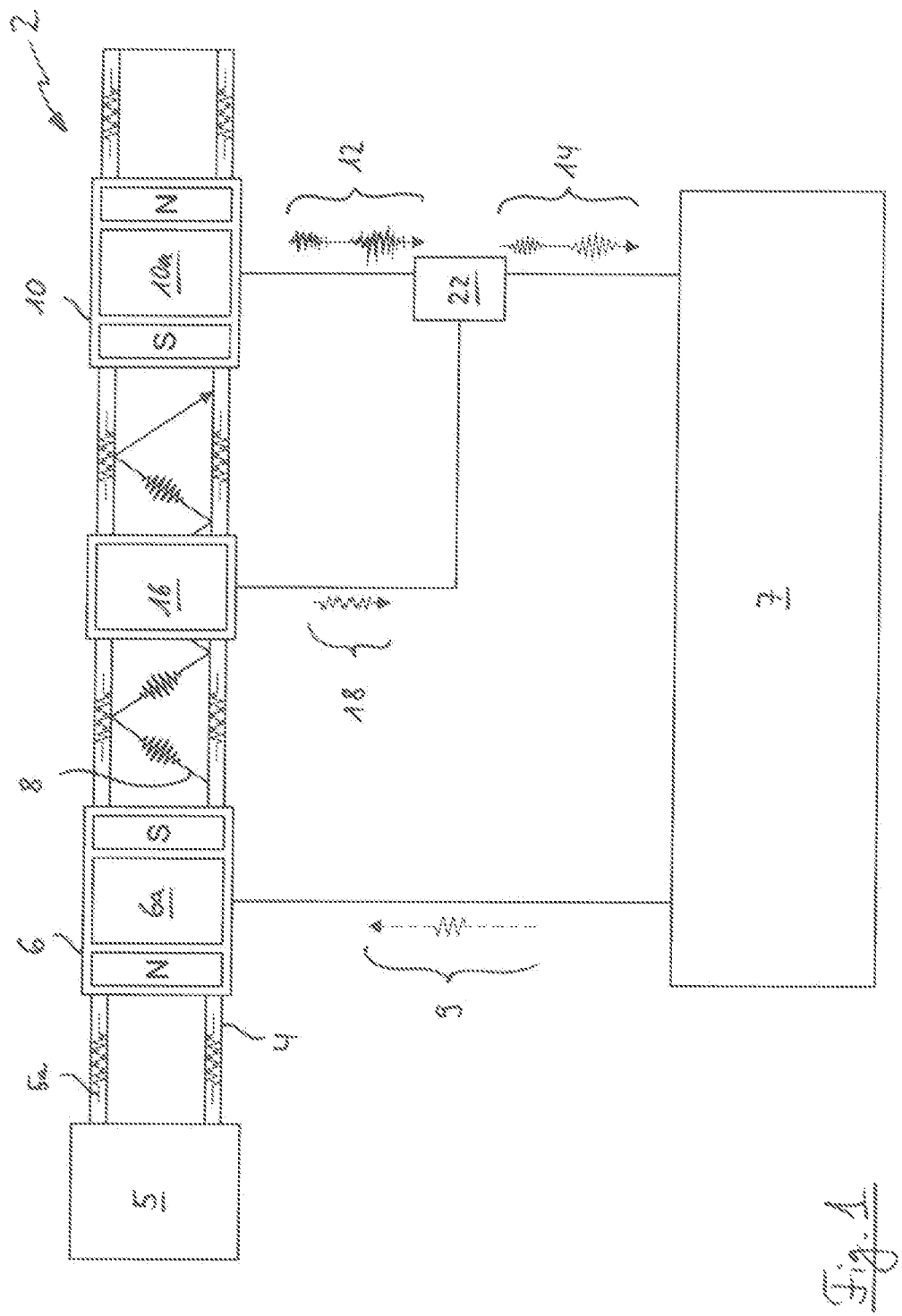
FIG. 1 shows one embodiment of the invention.

Insofar as expedient, identical or similarly acting parts are denoted with identical reference numbers.

Individual technical features of the example embodiments described below can also be combined with example embodiments described above and features of the independent claims and any further claims to form subject-matter according to the invention.

Different example embodiments of a measurement arrangement 2 which carries out an ultrasound flow measurement on a conductive object 4 designed as a pipeline are shown in FIGS. 1 to 8. An interference source 5 interacting with the object 4—illustrated schematically by direct contact of the interference source 5 with a front side of the object 4—generates interference which propagates through the object wall and is injected into the induction coils 6a, 10a, 16 of the measurement system. A first ultrasound wave 8 is generated in the object 4 by means of a first EMAT transmit transducer 6 of the measurement arrangement 2 which is positioned on or near a surface of the object 4 and which has a first transmit transducer induction coil 6a having at least one conductor path. To do this, the first EMAT transmit transducer 6 is excited by a control and evaluation unit 7 of the measurement arrangement 2 by means of an alternating current pulse 9 (ultrasound waves, signals or pulses or current pulses not shown in FIGS. 3, 5, 7 and 8) which interacts with the magnetic field of the transducer—illustrated by the magnetic poles N, S. The polarity of the magnetic field shown in the figures serves merely for illustrative purposes. It is clear that the polarity can also be designed differently or that the magnetic field can be generated by an electromagnet having a variable magnetic field. A first receive signal 12 is detected by means of a first EMAT receive transducer 10 of the measurement arrangement 2 which is positioned on or near the surface of the object 4 and which has a first receive transducer induction coil 10a having at least one conductor path, wherein the first receive signal 12 comprises a first ultrasound signal 14 resulting at least partially from the first ultrasound wave 8 which has propagated through at least a part of the object 4, and a first electromagnetic interference field. A second receive signal 18 which comprises at least a second electromagnetic interference signal is detected by means of a first receive means of the measurement arrangement 2, in particular while the first receive signal 12 is detected by the first EMAT receive transducer 6. At least the first receive signal 12 and the second receive signal 18 are processed jointly in an interference suppression operation by means of an interference suppression means 22 of the measurement arrangement 2, wherein at least the first receive signal 12 is at least partially interference-suppressed.

In the embodiment shown in FIG. 1, the second receive signal 18 is detected by a receive means induction coil 16 of the first receive means positioned on or near the surface of the object 4 and having at least one conductor path. The detected second interference signal is a coil interference signal here. The receive means induction coil 16 is preferably essentially identical in structure to the first receive transducer induction coil 10a, whereby the first interference signal and the second interference signal have essentially the same characteristics, resulting in a particularly effective interference suppression during the interference suppression operation.

In this embodiment, no magnetic field is present on the receive means induction coil 16, so that, unlike the EMAT transducers 6, 10, the receive means captures no signal which results from the first ultrasound wave 8.

Figure 2:
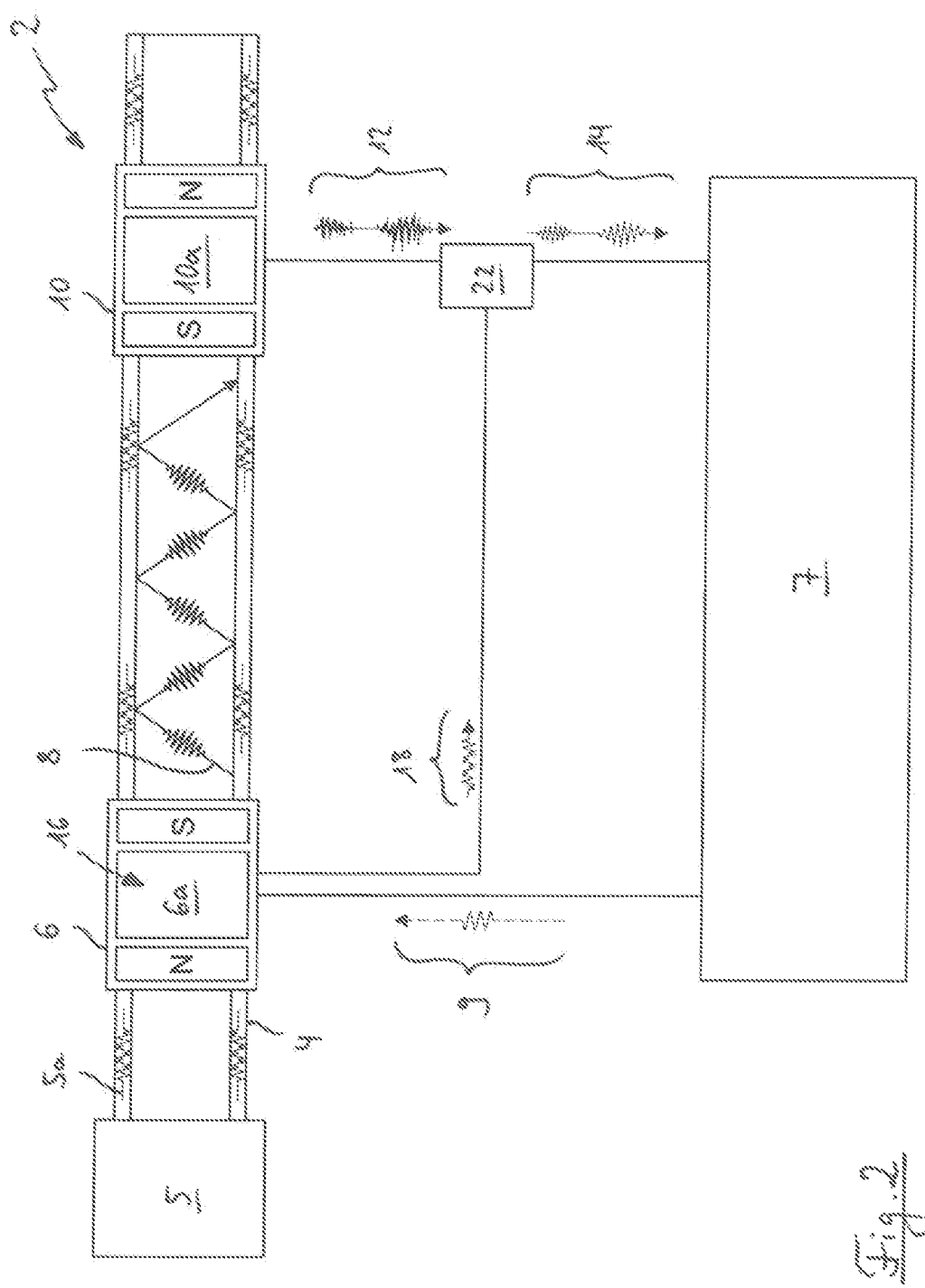
FIG. 2 shows a further embodiment of the invention.

According to the embodiment shown in FIG. 2, the first transmit transducer induction coil 6a is used as the receive means induction coil 16 for detecting the second receive signal 18. For example, in the case where the measurement arrangement 2 has more than two EMAT transducers, a further induction coil of the measurement arrangement 2 differing from the receive transducer induction coil 10a can alternatively serve as the receive means induction coil 16.

Figure 3:
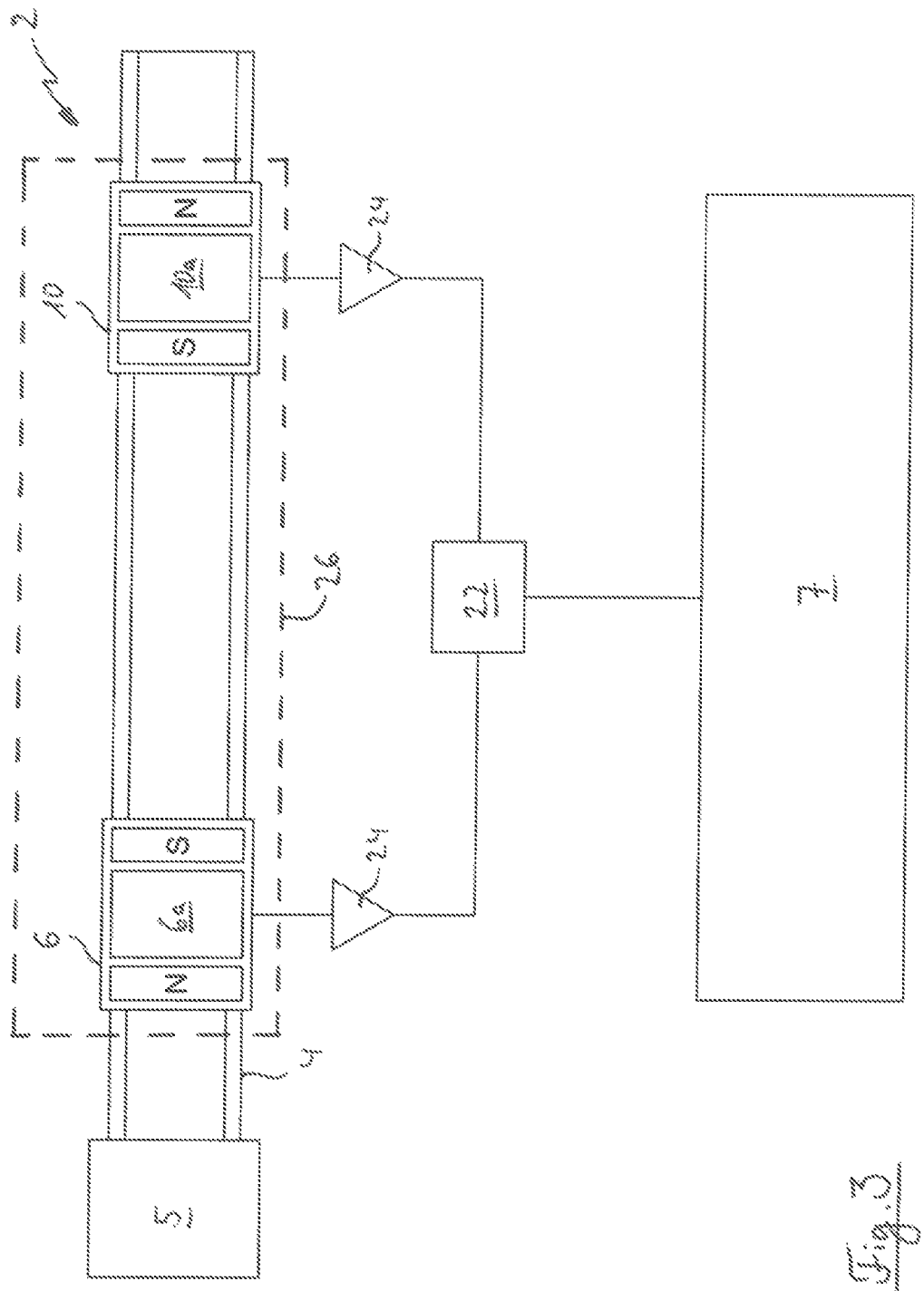
FIG. 3 shows a further embodiment of the invention.

In the embodiment shown in FIG. 3, similar to FIG. 2, the first EMAT transmit transducer 6 is used as the receive means. The first receive signal 12 and the second receive signal 18 further pass through a first amplifier stage 24 before they are processed using the interference suppression means 22 in the interference suppression operation. As a result, particularly if an interference suppression means 22 having inductive components, such as e.g. a common-mode choke, is used, the inductance is not increased in a sensor area 26 of the measurement arrangement 2 which comprises at least the first EMAT transmit transducer 6 and the first EMAT receive transducer 10, as a result of which the method is also applicable in areas at risk from explosion.

FIG. 4 shows a further embodiment in which the first EMAT transmit transducer 6 is used as the receive means. For reasons of clarity, no ultrasound waves, signals or pulses are shown here. The first receive signal 12 and the second receive signal 18 pass through an explosion protection barrier 28 (EX barrier) of the measurement arrangement 2 protecting the sensor area 26 of the measurement arrangement 2 before they are processed in the interference suppression operation. As a result, the method can also be carried out in areas at risk from explosion. In particular, voltage-limiting diodes are used to implement the explosion protection barrier 28.

FIG. 5 shows a further embodiment with an explosion protection barrier 28 in which the EMAT transducers 6, 10 are designed for both transmission and reception. Switches 30 can be used to switch between a transmit and receive mode of the EMAT transducers 6, 10. The explosion protection barrier 28 is to be positioned in such a way that the sensor area 26 is protected at least from the receive lines leading to the interference suppression means 22.

FIG. 6 shows an embodiment similar to FIG. 3. However, the first receive signal 12 and the second receive signal 18 are jointly processed by means of electronic subtraction as the interference suppression operation. The signals are fed to a digital circuit as the interference suppression means 22, wherein, following the amplification, they in each case first pass through an analogue-digital converter 32.

FIG. 7 shows a further embodiment of the measurement arrangement 2 in which the EMAT transducers 6, 10 are designed for, in particular simultaneous, transmission and reception. For reasons of clarity, no ultrasound waves, signals or pulses are shown here. The first EMAT transmit transducer 6 simultaneously serves as a second EMAT receive transducer 36, and the first EMAT receive transducer 10 simultaneously serves as a second EMAT transmit transducer 34. The first EMAT transmit transducer 6 generates the first sound wave 8 modulated with a first modulation pattern, while the first EMAT receive transducer 10 captures a first receive signal 12 which comprises both the first ultrasound signal 14 resulting at least partially from the first ultrasound wave 8 and also the first interference signal. The second EMAT transmit transducer 34 further generates a second ultrasound wave modulated with a second modulation pattern, wherein the second EMAT receive transducer 36 captures the second receive signal 18 which, along with the second interference signal in the form of a coil interference signal, also comprises a second ultrasound signal resulting at least partially from the second ultrasound wave.

The measurement arrangement 2 has a modulation means 38 which, in this embodiment, is part of the control and evaluation unit 7, for the modulation. Due to the modulation, even following the detection, the first ultrasound signal 14 can be assigned to the first ultrasound wave 8 and the second ultrasound signal can be assigned to the second ultrasound wave. Both the first receive signal 12 and the second receive signal can be processed jointly in an interference suppression operation running on the interference suppression means 22, wherein both receive signals are at least partially interference-suppressed. The interference-suppressed total signal is then fed to a first demodulation means 40 and to a second demodulation means 42, wherein the first demodulation means 40 supplies the first ultrasound signal 14 through demodulation according to the first modulation pattern, and the second demodulation means 42 supplies the second ultrasound signal through demodulation according to the second modulation pattern. Finally, the interference-suppressed first ultrasound signal 14 and the interference-suppressed second ultrasound signal are forwarded separately to the control and evaluation unit 7 for further evaluation. The demodulation means 40, 42 can also be designed as individual components and/or can be integrated into the control and evaluation unit 7.

FIG. 8 shows an embodiment similar to FIG. 7, wherein the measurement arrangement 2 additionally has a second receive means in the form of an earthed line 44 which serves to detect a third receive signal. Here, the third receive signal comprises a third electromagnetic interference signal, more precisely an earthing interference signal. This earthing interference signal has its origin in that the object 4 is earthed and a potential difference in relation to the measurement system galvanically isolated therefrom is injected as an interference signal into the measurement system. For the measurement of this third receive signal, the second receive means has a capacitive, signal-transmitting connection to a measurement line 46 of the measurement arrangement 2, whereby the galvanic isolation is maintained.

In this embodiment, two types of interference signals are therefore detected: the second EMAT receive transducer 36 serves as the first receive means and captures a coil interference signal as part of the second receive signal 18. The earthed line 18 serves as the second receive means and captures an earthing interference signal as part of the third receive signal. The first receive signal 12, the second receive signal 18 and the third receive signal are jointly processed in the interference suppression operation, wherein the first receive signal 12 and the second receive signal 18 are at least partially interference-suppressed. In this way, both interference 5a originating from interference sources 5 interacting with the object 4 and interference resulting from the potential difference between the measurement system and earthed structures are suppressed. The signal-to-noise ratio is thus considerably improved in the underlying flow measurement here.

For improved noise suppression, in particular of the interference resulting from the potential difference between the measurement system and the earthed object 4, a correlation analysis is carried out, preferably before and/or during the ultrasound measurement, in order to define a correlation, in particular an amplitude and/or phase relationship, between the first receive signal 12 and the third receive signal or between the first interference signal and the third interference signal. If a relationship is defined between the interference signals by determining corresponding correlation factors, characteristics of the first interference signal can be predicted or anticipated by means of a continuous measurement of the second interference signal. This prediction can then be used during the interference suppression operation in order to achieve an improved interference suppression of the first receive signal 12 and, where appropriate, the second receive signal.

The invention claimed is:

1. A measurement method on an electrically conducting object, the measurement method comprising the steps of:
generating a first ultrasound wave in the object by a first EMAT transmit transducer of a measurement arrangement which is positioned on or near a surface of the object and which has a first transmit transducer induction coil having at least one conductor path, and
receiving a first receive signal, by a first EMAT receive transducer which is positioned on or near the surface of the object and which has a first receive transducer induction coil having at least one conductor path, wherein the first receive signal comprises a first ultrasound signal resulting at least partially from the first ultrasound wave which has propagated through at least a part of the object, and a first electromagnetic interference signal;
detecting a second receive signal comprising at least a second electromagnetic interference signal by a first receive means of the measurement arrangement while the first receive signal is detected by the first EMAT receive transducer; and
joint processing of at least the first receive signal and the second receive signal in an interference suppression operation by an interference suppression means of the measurement arrangement,
wherein at least the first receive signal is at least partially interference-suppressed, and
wherein the first electromagnetic interference signal and the second electromagnetic interference signal are generated at least in part by a common source that is different than the electrically conducting object.

2. The measurement method according to claim 1, wherein the second receive signal is detected by a receive means induction coil of the first receive means which is positioned on or near the surface of the object and which has at least one conductor path, wherein a coil interference signal is detected as the second interference signal.

3. The measurement method according to claim 2, wherein the receive means induction coil used to detect the second receive signal is at least essentially identical in structure to the first receive transducer induction coil.

4. The measurement method according to claim 2, wherein the first transmit transducer induction coil or a further induction coil of the measurement arrangement differing from the receive transducer induction coil is used to detect the second receive signal.

5. The measurement method according to claim 1, wherein the second receive signal is detected by a line of the measurement arrangement connected in an electrically conducting manner to the object or to an earthed housing part of a housing protecting the measurement arrangement or otherwise earthed as the first receive means, wherein an earthing interference signal is detected as the second interference signal.

6. The measurement method according to claim 5, wherein the second receive signal tapped via the line is injected into a measurement line of the measurement arrangement while maintaining a galvanic isolation.

7. The measurement method according to claim 1, wherein at least the first receive signal and the second receive signal are fed to an analogue and/or digital, electrical and/or electronic component or to an analogue and/or digital, electrical and/or electronic circuit as the interference suppression means.

8. The measurement method according to claim 1, wherein the first receive signal and the second receive signal are fed to a common-mode choke as the interference suppression means and are subjected to an inductive subtraction as the interference suppression operation.

9. The measurement method according to claim 1, wherein the first receive signal and the second receive signal pass through a first amplifier stage before they are processed in the interference suppression operation.

10. The measurement method according to claim 1, wherein the first receive signal and the second receive signal pass through an explosion protection barrier (EX barrier) of the measurement arrangement protecting a sensor area of the measurement arrangement which comprises at least the first EMAT transmit transducer and the first EMAT receive transducer before they are processed in the interference suppression operation.

11. The measurement method according to claim 1, wherein the first receive signal and the second receive signal are subjected to a correlation analysis, wherein a correlation between the first electromagnetic interference signal and the second electromagnetic interference signal is determined.

12. The measurement method according to claim 11, wherein a correlation analysis is carried out for at least two different frequencies depending on the frequency of the first ultrasound wave.

13. The measurement method according to claim 1, wherein the first electromagnetic interference signal and at least the second electromagnetic interference signal are detected jointly, the first electromagnetic interference signal by the first EMAT receive transducer, and at least the second electromagnetic interference signal by the first receive means, wherein a correlation between the first electromagnetic interference signal and the second electromagnetic interference signal is determined.

14. The measurement method according to claim 11, wherein the correlation analysis is carried out multiple times in succession and weighted correlation factors are determined on the basis of a statistical analysis of correlation factors determined by respective correlation analyses.

15. The measurement method according to claim 1, further including the following steps:
  detecting a third receive signal differing from the second receive signal and comprising at least a third electromagnetic interference signal, by a second receive means of the measurement arrangement differing from the first receive means, wherein the third electromagnetic interference signal is a coil interference signal or an earthing interference signal,
  joint processing of at least the third receive signal with the first receive signal and the second receive signal in the interference suppression operation by the interference suppression means of the measurement arrangement,
  wherein at least the first receive signal is at least partially interference-suppressed.

16. The measurement method according to claim 1, wherein a second ultrasound wave is generated in the object by a second EMAT transmit transducer of the measurement arrangement which is positioned on or near the surface of the object and which has a second transmit transducer induction coil having at least one conductor path, and a second EMAT receive transducer of the measurement arrangement which is positioned on or near the surface of the object and which has a second receive transducer induction coil having at least one conductor path detects the second receive signal,
  wherein, in addition to the second electromagnetic interference signal, the second receive signal comprises a second ultrasound signal resulting at least partially from the second ultrasound wave which has propagated through at least a part of the object,
  wherein the first ultrasound wave is modulated with a first modulation pattern and the second ultrasound wave is modulated with a second modulation pattern so that, following the detection, a unique assignment of the first ultrasound signal to the first ultrasound wave and of the second ultrasound signal to the second ultrasound wave is enabled,
  wherein both the first receive signal and the second receive signal are in each case at least partially interference-suppressed by the joint processing in the interference suppression operation,
  wherein, following the interference suppression operation, the first ultrasound signal and the second ultrasound signal are obtained separately by a demodulation.

17. The measurement method according to claim 16, wherein the modulation patterns used for the modulation are orthogonal to one another.

18. A measurement arrangement to carry out a measurement method on an electrically conducting object according to claim 1, the measurement arrangement comprising:
  a first EMAT transmit transducer which is positioned on or near a surface of the object and which has a first transmit transducer induction coil having at least one conductor path for generating a first ultrasound wave in the object;
  a first EMAT receive transducer which is positioned on or near the surface of the object and which has a first receive transducer induction coil having at least one conductor path for detecting a first receive signal, wherein the first receive signal comprises a first ultrasound signal resulting at least partially from the first ultrasound wave which has propagated through at least a part of the object and a first electromagnetic interference signal,
  a first receive means for detecting a second receive signal comprising at least a second electromagnetic interference signal, and
  an interference suppression means,
  wherein the measurement arrangement is designed to process the first receive signal and the second receive signal by the interference suppression means in an interference suppression operation which at least partially suppresses the interference of at least the first receive signal.

19. The measurement arrangement according to claim 18, wherein the first receive means comprises a receive means induction coil.

20. The measurement arrangement according to claim 18, wherein the receive means induction coil is at least essentially identical in structure to the first receive transducer induction coil.

21. The measurement arrangement according to claim 18, wherein the receive means induction coil is formed by the first transmit transducer induction coil or a further induction coil of the measurement arrangement differing from the receive transducer induction coil.

22. The measurement arrangement according to claim 18, wherein the measurement arrangement comprises a line connected in an electrically conducting manner to the object or to an earthed housing part of a housing protecting the measurement arrangement or otherwise earthed for detecting the second receive signal.

23. Measurement arrangement (2) according to claim 22, characterised in that the line (44) is connected to a measurement line (46) of the measurement arrangement via a signal-transmitting, in particular capacitive, connection, while maintaining a galvanic isolation.

24. The measurement arrangement according to claim 18, wherein the interference suppression means comprises an analogue and/or digital electrical and/or electronic component, or an analogue and/or digital, electrical and/or electronic circuit.

25. The measurement arrangement according to claim 18, wherein a first amplifier stage of the measurement arrangement is connected between the interference suppression means on the one hand and the first EMAT receive transducer and the first receive means on the other hand.

26. The measurement arrangement according to claim 18, wherein an explosion protection barrier (EX barrier) of the measurement arrangement is configured between the interference suppression means on the one hand and at least the first EMAT receive transducer and the first receive means on the other hand.

27. The measurement arrangement according to claim 18, wherein the measurement arrangement comprises a second receive means for detecting a third receive signal comprising at least a third electromagnetic interference signal, wherein the measurement arrangement is designed to process at least the third receive signal with the first receive signal and with the second receive signal in an interference suppression operation which at least partially suppresses the interference of at least the first receive signal.

28. The measurement arrangement according to claim 18, wherein the measurement arrangement comprises a second EMAT transmit transducer which is positioned on or near the surface of the object and which has a second transmit transducer induction coil having at least one conductor path for generating a second ultrasound wave in the object, and
the measurement arrangement further comprises a second EMAT receive transducer which is positioned on or near the surface of the object and which has a second receive transducer induction coil having at least one conductor path for detecting the second receive signal,
wherein, in addition to the second electromagnetic interference signal, the second receive signal comprises a second ultrasound signal resulting at least partially from the second ultrasound wave which has propagated through at least a part of the object,
wherein the measurement arrangement further comprises at least one modulation means which modulates the first ultrasound wave with a first modulation pattern and the second ultrasound wave with the second modulation pattern so that, following the detection, a unique assignment of the first ultrasound signal to the first ultrasound wave and of the second ultrasound signal to the second ultrasound wave is enabled,
wherein the measurement arrangement is designed in such a way that both the first receive signal and the second receive signal are in each case at least partially interference-suppressed by the joint processing in the interference suppression operation,
wherein the measurement arrangement further comprises at least one demodulation means, and the measurement arrangement is designed in such a way that, following the interference suppression operation, the first ultrasound signal and the second ultrasound signal are separated.

29. The measurement arrangement according to claim 18, wherein the measurement arrangement comprises an evaluation unit, wherein the measuring arrangement is designed to perform a correlation analysis by means of the evaluation unit.

30. The measurement arrangement according to claim 29, wherein the measurement is designed to perform a correlation analysis for at least two different frequencies depending on the frequency of the first ultrasound wave.

31. The measurement arrangement according to claim 29, wherein the measurement is designed to determine a correlation between the jointly detected first electromagnetic interference signal and the second electromagnetic interference signal, wherein the first electromagnetic interference signal is detected by the first EMAT receive transducer and the second electromagnetic interference signal is detected by the first receive means.

32. The measurement arrangement according to claim 29, wherein the measurement is designed to carry out the correlation analysis multiple times in succession and to determine weighted correlation factors on the basis of a statistical analysis of correlation factors determined by respective correlation analyses.

\* \* \* \* \*